May 30, 1961 A. M. IOAKIMIDIS 2,986,659

SINGLE POLE, DOUBLE THROW ELECTRONIC GATE CIRCUIT

Filed Dec. 2, 1959

INVENTOR.

BY A. M. IOAKIMIDIS

J. Warren Whitesel

ATTORNEY

United States Patent Office 2,986,659

Patented May 30, 1961

2,986,659

SINGLE POLE, DOUBLE THROW ELECTRONIC GATE CIRCUIT

Anthony M. Ioakimidis, Chicago, Ill., assignor to International Telephone and Telegraph Corporation, a corporation of Maryland Filed Dec. 2, 1959, Ser. No. 856,764

8 Claims. (Cl. 307—88.5)

Figures 1, 2:
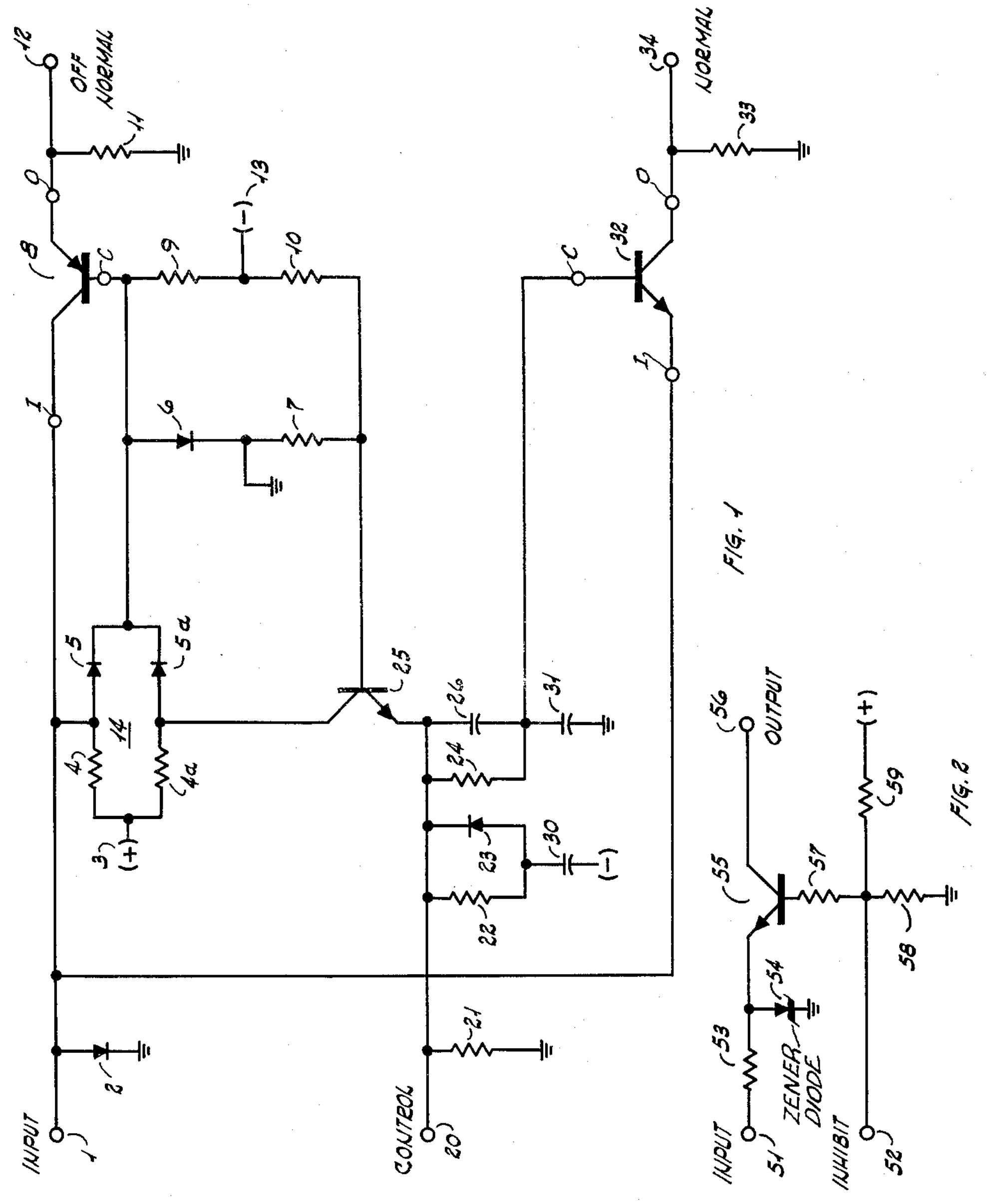

This invention relates to electronic logic circuits and more particularly to gate circuits for selectively switching signals.

In the field of logic circuitry, it is frequently necessary to switch signals appearing on certain terminals to a selected one of several other terminals under the influence of control signals. In the past, one manner in which this function was accomplished was by means of an electromagnetic relay having contacts of single pole, double throw configuration wherein input signals applied to first contacts pass through the relay contact assembly and appear at a second or normal output terminal. However, if the relay is energized when input signals are applied, output signals appear at a third or off-normal terminal. Furthermore, these functions have also been performed electronically by means of logic circuitry. However, prior logic circuitry of the type described has introduced a high series resistance between a driving source and a load circuit and has presented a relatively low resistance shunting the driving source. Therefore, it is desirable to provide logic circuitry which introduces a lower series resistance between a driving source and loading circuits and which provides a much higher resistance in shunt with the driving source.

An object of this invention is to provide new and improved electronic logic circuitry.

Yet another object of this invention is to provide for selectively switching signals appearing on an input terminal to either of two output terminals depending upon the presence or absence of control signals.

In accordance with this invention, an electrical network is provided with a plurality of interconnected terminals. A plurality of electronic devices are connected between individually associated output terminals and a common input terminal. Hence, the conductivity of each path extending from the input terminal to an output terminal is determined by the conductivity of the electronic device which is individually associated therewith. When an electronic device in one leg of the interconnected network is in a conductive condition all other electronic devices are in a non-conductive condition thus causing input signals to appear at only the output terminal which is individually associated with the conductive electronic device. When a control signal is applied, the conductive device becomes non-conductive and a non-conductive device becomes conductive, thereby switching input signals from a first to a second output terminal. Therefore, there may be a selection of the output terminal which is to transmit the input signals that are applied to the network.

The above mentioned and other objects of this invention together with the manner of obtaining them will become more apparent and the invention itself will be best understood by making reference to the following description of two embodiments of the invention taken in conjunction with the accompanying drawings in which:

Figure 1 shows an electronic circuit for switching signals appearing at one input terminal to either of two output terminals; and Figure 2 shows an electronic circuit which conducts signals from an input terminal to an output terminal unless a control potential is applied to an inhibit terminal.

As shown in Fig. 1, an electronic gate circuit includes an input terminal 1, a control terminal 20, and a pair of output terminals 12, 34. The object of the circuit is to transmit signals appearing at input terminal 1 to normal output terminal 34, unless a control signal also appears at control terminal 20, in which case the signals are transmitted to off normal output terminal 12. To accomplish this end, a pair of electronic switching devices, here shown as junction type transistors 8 and 32, are interposed between the input terminal and the output terminals. For reasons which will become more apparent, the transistor 8 is a PNP type and the transistor 32 is and NPN type. Each of these transistors includes input, output, and control electrodes designated "I," "O," and "C," respectively. Transistor 32 has its input electrode I connected to input terminal 1, its output electrode O connected to normal output terminal 34, and its control electrode C biased at the reference or ground potential extended through resistors 21, 24 (in series). Transistor 8 has its input electrode I connected to input terminal 1, its output electrode O connected to off-normal output terminal 12, and its control electrode C biased by a voltage divider connected between potential points 3, 13 and including an "AND" gate 14, and a resistor 9.

Briefly, all transistors of Figure 1 are in a non-conductive condition prior to an application of signals at either terminal 1 or terminal 20. When a driving source applies an input signal at terminal 1, the potential on the emitter of transistor 32 is made more negative than the base thereof, transistor 32 turns-on and the input signal appears at output terminal 34. At the same time, switching device 8 presents an extremely high resistance between terminals 1 and 12, thus preventing input signals which are applied at terminal 1 from effectively appearing at off-normal output terminal 12. When proper signals are applied at both terminal 1 and terminal 20, the base of transistor 32 becomes more negative than the emitter thereof, thus turning-off transistor 32 and thereby connecting a very high resistance in the circuit extending from input terminal 1 to output terminal 34. The potential on control terminal 20 turns-on transistor 25 by making the emitter more negative than the base thereof. Since both the upper and lower legs of "AND" circuit 14 are now marked, transistor 8 is switched to a high conductive, or low resistance condition so that signals applied at input terminal 1 appear at output terminal 12.

The circuit of Figure 2 is essentially the same as the bottom half of the circuit shown in Figure 1. That is, if an input signal is applied at terminal 51, transistor 55 turns-on and the input signal appears at output terminal 56. If signals are applied simultanuously at input terminal 51 and inhibit terminal 52, transistor 55 is biased to cut-off; therefore, the input signal does not appear at output terminal 56.

In greater detail, means is provided for extending signal to normal output terminal 34 when a negative input signal is applied at terminal 1 (Figure 1) and no control signal is applied at terminal 20. That is, prior to the application of an input signal at terminal 1, the base of transistor 32 is at ground potential, the biasing circuit extending through resistances 24 and 21. When a drive or input signal is applied at terminal 1, the emitter of transistor 32 becomes more negative than its base; therefore, transistor 32 turns-on and current flows from the driving source (not shown) through terminal 1, the emitter, base, and collector of transistor 32 to output terminal 34.

Under the conditions being described (i.e. a signal is applied at terminal 1 and not at terminal 20) no effective output signal appears at off-normal output terminal 12. That is, a parallel circuit 14 forms an "AND" gate which is part of a voltage divider that establishes potentials which normally biases switching transistor 8 to an effectively "off" condition. When a negative signal is applied to input terminal 1, the upper leg or input terminal of "AND" gate 14 is effectively blocked by a change of potential which back biases diode 5. Conversely, when a negative signal is applied to control terminal 20, the lower leg or input terminal of "AND" gate 14 is effectively blocked by a change of potential which back biases diode **5*a* (as explained below). However, the bias on the base of switching transistor 8 does not change unless both legs or input terminals of "AND" gate 14 are marked simultaneously, i.e. if only the upper leg is marked, the voltage divider which controls the potential on the base of transistor 8 extends from positive battery 3 through resistance 4*a*, diode 5*a* and resistance 9 to negative battery 13 and if only the lower leg is marked, the voltage divider which controls the potential on the base of switching transistor 8 extends from positive battery 3 through resistance 4, diode 5 and resistance 9 to negative battery 13. When both legs or input terminals of "AND" gate 14 are marked, both of the diodes 5 and 5*a* are back biased, the potential at the base of switching transistor 8 goes negative from battery 13 and switching transistor 8 is effectively turned-on. Under the conditions being described, only the upper leg of "AND" gate 14 is blocked, switching transistor 8 remains in an effectively "off" condition and subsequently no signal is produced at output terminal 12**.

Next, it is assumed that negative control signals are applied simultaneously at both terminal 1 and terminal 20; whereupon, the output is switched from normal terminal 34 to off-normal terminal 12. In greater detail, when the control potential applied at terminal 20 is more negative than the drive signal applied at terminal 1, the base of transistor 32 is more negative than the emitter thereof and transistor 32 is biased to an off-condition, thus inserting an extremely high resistance between terminals 1 and 34. Normally, the base of transistor 25 is at a potential which is determined by the voltage divider consisting of resistances 7 and 10. Therefore, transistor 25 becomes conductive when terminal 20 is negative relative to the base thereof. The negative potential applied at terminal 20 is conducted from the emitter to the collector of transistor 25 and appears at the junction of resistance **4*a* and diode 5*a* (which is, therefore, back biased). Diode 5 in the upper leg of "AND" circuit 14 is also back biased by a negative potential which is applied at input terminal 1. Since both dodes 5 and 5*a* are back biased, negative potential 13 is applied through resistance 9 to the base of transistor 8, thus switching it into saturation or an "on" condition and providing an effective short circuit between input terminal 1 and off-normal output terminal 12. Hence, the input driving signal applied to terminal 1 appears at off-normal output terminal 12 but not at normal output terminal 34 when control terminal 20** is properly energized.

Resistances 11 and 33 provide alternate paths to permit capacity coupling between output terminals 12 and 34 and succeeding equipment. Diode 2 provides a path to ground which eliminates the possibility of having larger input voltages than the control voltage.

Means is provided for varying the time relationship of the output signals on the two output terminals; two factors are involved, one is the slope of the output wave form and the other is the time lag between removal of a signal at one output terminal and appearance of another signal at the other output terminal. More specifically, a net-work comprising transistor 25 and its associated components such as resistors 7, 10, 21, 22 and 24 and capacitors 26, 30 and 31 is provided to control the time of the appearances of output voltages at the off-normal output terminal 12 and the normal output terminal 34. The aforementioned network is extremely flexible. By merely changing the values of the capacitive and/or resistive components associated with the network, transistors 32 and 8 can be separately turned on or off so that the time during which output signals appear on the output terminals is varied. The values of the components can be selected so that the output on one terminal appears just as the output on the other terminal is removed; or the output on one terminal appears a finite time after the output on the other terminal is removed; or the output on one terminal appears prior to the removal of the output on the other terminal. In this embodiment of the invention, the circuit values of the components associated with transistor 25 are such that there is a small but finite time period during which no signal appears at either off-normal terminal 12 or normal terminal 34. In greater detail when negative signals are removed from control terminal 20 biasing potential applied via the circuit extending from ground through resistances 21 and 24 changes the charge on the base electrode of transistor 32. If there were no network associated with transistor 25, an excessive accumulation of charge carriers may occur and delay cut-off-time—a typical accumulation of charge carriers sometimes being called "hole storage." However, with the introduction of capacitors 26, 30 and 31, removal of negative potential from terminal 20 results in a surge current which is applied to the base electrode of transistor 32 thereby sweeping offending charge carriers from the semi-conductive material and providing a very fast turn-off and turn-on time factor.

The circuitry of the inhibit gate of Figure 2 is essentially the same as the circuitry that is shown in connection with transistor 32 in Figure 1. That is, normally the base of transistor 55 is at a potential which is established by an application of ground through resistances 58 and 59 to battery. When a negative potential signal is applied at terminal 51, the emitter of transistor 55 is more negative than the base; therefore, transistor 55 turns-on and the input or driving signal applied at terminal 51 appears at output terminal 56. If a signal is applied to terminal 52, the base of transistor 55 is made more negative than the emitter; therefore, transistor 55 is blocked and no input drive signal may be conducted from input terminal 51 to output terminal 56. Zener diode 54 is provided to protect transistor 55 from excessive input voltages and to insure that the control voltage is larger than the input voltage. This use of Zener diode provides proper cut-off conditions for transistor 55, and thereby provides positive switching action.

While the principles of this invention have been described in connection with specific apparatus, it is to be clearly understood that this description is made only by way of example and not as a limitation to the scope of the invention.

I claim:

1. An electronic gate circuit comprising an input terminal, a control terminal, and at least two output terminals, a plurality of electronic devices, each having at least input, output, and control electrodes; means for coupling each of said input electrodes to said input terminal; means for coupling said output electrodes to individually associated output terminals; means for normally applying a reference signal to said control electrode of one of said electronic devices, said reference signal having characteristics such that said one electronic device is effectively turned "on" responsive to an application of an input signal to said input terminal; means for normally biasing another of said electronic devices to an effectively "off" condition; and means responsive to simultaneous application of signals to said control terminal and to said input terminal for effectively turning "off" said one electronic device and for effectively turning "on" said other electronic device, wherein said means for biasing said other electronic device comprises a two input "AND" gate, said input terminal being effectively coupled to control one input of said "AND" gate and said control terminal being effectively coupled to control another input of said "AND" gate.

2. The gate circuit of claim 1 and a third electronic device having input, control and output electrodes, said means for coupling said control terminal to said other "AND" gate input comprising; means for coupling said input electrode of said third device to said control terminal, means for coupling a reference potential to said control electrode of said third device, said reference potential having characteristics such that said third device conducts responsive to an application of signals to said control terminal, and means for coupling said output electrode of said third device to said other input of said "AND" gate.

3. The gate circuit of claim 2 wherein at least said one device comprises semi-conductive material, and means comprising capacitance coupled to said control electrode of said one device for sweeping charge carriers from said semi-conductive material.

4. The gate circuit of claim 3 wherein said other electronic device comprises a switching transistor, and said "AND" gate comprises means coupled to said control electrode of said switching transistor.

5. An electronic gate circuit comprising an input terminal, a control terminal, and at least two output terminals, a plurality of electronic devices, each having at least input, output, and control electrodes; means for coupling each of said input electrodes to said input terminal; means for coupling said output electrodes to individually associated output terminals; means for normally applying a reference signal to said control electrode of one of said electronic devices, said reference signal having characteristics such that said one electronic device is effectively turned "on" responsive to an application of an input signal to said input terminal; means for normally biasing another of said electronic devices to an effectively "off" condition; and means responsive to simultaneous application of signals to said control terminal and to said input terminal for effectively turning "off" said one electronic device for effectively turning "on" said other electronic device, said means for turning on said other electronic device comprising; a third electronic device having input, output, and control electrodes; means for applying a reference potential to said control electrode of said third device; means for coupling said input electrode of said third device to said control terminal; and means for coupling said output electrode of said third device to control said bias on said other device.

6. The gate circuit of claim 5 wherein said other electronic device comprises a switching transistor, and means whereby said output electrode of said third device is effectively coupled in parallel with said input terminal to said control electrode of said switching transistor.

7. The gate circuit of claim 6 and means coupled to said input terminal for limiting input signals.

8. The gate circuit of claim 6 wherein said parallel coupling to said control electrode of said switching transistor comprises a two input "AND" gate, said input terminal being effectively coupled to one input of said "AND" gate and said control terminal being effectively coupled via said third device to another input of said "AND" gate.

References Cited in the file of this patent

UNITED STATES PATENTS

| | | |
|---|---|---|
| 2,396,395 | Smith | Mar. 12, 1946 |
| 2,718,613 | Harris | Sept. 20, 1955 |
| 2,837,644 | Shallon | June 3, 1858 |
| 2,864,961 | Lohman | Dec. 16, 1958 |
| 2,885,573 | Clapper | May 5, 1959 |
| 2,891,172 | Bruce | June 16, 1959 |
| 2,900,506 | Whetter | Aug. 18, 1959 |
| 2,933,625 | Townsend | Apr. 19, 1960 |
| 2,946,010 | Tarczy-Hornoch | July 19, 1960 |